(12) United States Patent
Gentili et al.

(10) Patent No.: US 11,527,807 B2
(45) Date of Patent: Dec. 13, 2022

(54) ELECTRONIC DEVICE HAVING FIRST AND SECOND COMPONENT CARRIER PARTS WITH CUT-OUTS THEREIN AND ADHESIVELY JOINED TO FORM A CAVITY THAT SUPPORTS AN ELECTRONIC COMPONENT THEREIN

(71) Applicant: AT&S Austria Technologie & Systemtechnik Aktiengesellschaft, Leoben (AT)

(72) Inventors: Fabrizio Gentili, Graz (AT); Sebastian Sattler, Graz (AT); Wolfgang Bösch, Graz (AT); Erich Schlaffer, St. Lorenzen (AT); Markus Kastelic, Zeltweg (AT); Bernhard Reitmaier, Pölstal/Möderbrugg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 143 days.

(21) Appl. No.: 16/977,115

(22) PCT Filed: Mar. 7, 2018

(86) PCT No.: PCT/EP2018/055649
§ 371 (c)(1),
(2) Date: Sep. 1, 2020

(87) PCT Pub. No.: WO2019/170230
PCT Pub. Date: Sep. 12, 2019

(65) Prior Publication Data
US 2021/0059044 A1 Feb. 25, 2021

(51) Int. Cl.
*H01P 3/08* (2006.01)
*H05K 1/02* (2006.01)
(Continued)

(52) U.S. Cl.
CPC .............. *H01P 3/087* (2013.01); *H01P 3/084* (2013.01); *H01P 11/003* (2013.01); *H05K 1/024* (2013.01);
(Continued)

(58) Field of Classification Search
CPC .............................. H01P 3/087; H01P 11/003
(Continued)

(56) References Cited

U.S. PATENT DOCUMENTS 3,863,181 A * 1/1975 Glance et al. .......... H01P 1/162
333/246
5,796,321 A * 8/1998 Caillat et al. .......... H01P 3/084
257/782
(Continued)

FOREIGN PATENT DOCUMENTS

DE 102016203613 A1 9/2017
EP 1553630 A1 7/2005
(Continued)

OTHER PUBLICATIONS

Wang, Y et al., „Compact Branch-Line Coupler Using substrate integrated Suspended Line Technology; IEEE Microwave and Wireless Components Letters; vol. 26, No. 2, Feb. 2016, pp. 95-97; IEEE, U.S.A.
(Continued)

*Primary Examiner* — Benny T Lee
(74) *Attorney, Agent, or Firm* — Robert A. Blaha; Smith Tempel Blaha LLC

(57) ABSTRACT

An electronic device and a method for manufacturing such an electronic device are described. The electronic device includes an electronic component, and a component carrier in which the electronic component is embedded. The component carrier includes a first component carrier part having a first cut-out portion and a second component carrier part
(Continued)

having a second cut-out portion, the first cut-out portion and the second cut-out portion facing opposite main surfaces of the electronic component. An electrically conductive material is provided on the surface of the first cut-out portion and on the surface of the second cut-out portion. The first cut-out portion and the second cut-out portion respectively form a first cavity and a second cavity on opposite sides of the electronic component.

18 Claims, 3 Drawing Sheets

(51) Int. Cl.
 *H05K 3/38* (2006.01)
 *H05K 3/46* (2006.01)
 *H01P 11/00* (2006.01)
(52) U.S. Cl.
 CPC ........... *H05K 1/0243* (2013.01); *H05K 3/386* (2013.01); *H05K 3/4611* (2013.01); *H05K 3/4697* (2013.01)
(58) Field of Classification Search
 USPC ........................................................ 333/238
 See application file for complete search history.

(56) References Cited

U.S. PATENT DOCUMENTS

| | | | | |
|---|---|---|---|---|
| 6,414,573 | B1 * | 7/2002 | Swineford et al. ..... | H01P 3/087 333/260 |
| 7,999,638 | B2 * | 8/2011 | Niman et al. ............. | H01P 3/08 333/246 |
| 2004/0048420 | A1 * | 3/2004 | Miller ..................... | H01P 3/084 438/106 |
| 2006/0028305 | A1 | 2/2006 | Dutta et al. | |
| 2007/0000687 | A1 | 1/2007 | Brist et al. | |

FOREIGN PATENT DOCUMENTS

| | | |
|---|---|---|
| WO | 2007127348 A2 | 11/2007 |
| WO | 2007149046 A1 | 12/2007 |

OTHER PUBLICATIONS

Wang, Y. et al.; „A High Performance Tandem Coupler Using Substrate Integrated Suspended Line Technology; IEEE Microwave and Wireless Components Letters; vol. 26, No. 5, May 2016, pp. 328-330; IEEE, U.S.A.

Wang, Y. et al.; "A Low Loss Branch Line Coupler Based on Substrate Integrated Suspended Line (SISL) Technology and Double-Sided Interconnected Strip Line (DSISL)"; IEEE, 978-1-4799-8767-2/15; pp. 1-3; IEEE, U.S.A.

Li, L. et al.; "A Novel Transition from Substrate Integrated Suspended Line to Conductor Backed CPW"; IEEE Microwave and Wireless Components Letters; vol. 26, No. 6, Jun. 2016, pp. 389-391; IEEE, U.S.A.

Du C. et al.; "Self-packaged SISL dual-band BPF using a new quadruple-mode resonator"; Electronics Letters, Jun. 23, 2016; vol. 52, No. 13, pp. 1143-1145.

Belenguer, A. et al.; "High-Performance Coplanar Waveguide to Empty Substrate Integrated Coaxial Line Transition"; IEEE Transactions on Microwave Theory and Techniques; vol. 63, No. 12, Dec. 2015, pp. 4027-4034; IEEE, U.S.A.

Belenguer, A. et al.; "Novel Empty Substrate Integrated Waveguide for High-Performance Microwave Integrated Circuits"; IEEE Transactions on Microwave Theory and Techniques; vol. 62, No. 4, Apr. 2014, pp. 832-839; IEEE, U.S.A.

Batev, P.; Communication Pursuant to Article 94(3) EPC in Patent Application No. 18710423.7; pp. 1-7; dated Jun. 3, 2022; European Patent Office; 80298, Munich, Germany.

* cited by examiner

ELECTRONIC DEVICE HAVING FIRST AND SECOND COMPONENT CARRIER PARTS WITH CUT-OUTS THEREIN AND ADHESIVELY JOINED TO FORM A CAVITY THAT SUPPORTS AN ELECTRONIC COMPONENT THEREIN

CROSS-REFERENCE TO RELATED APPLICATIONS

The present application is a U.S. national phase application that emerged from the International Application No. PCT/EP2018/055649 filed Mar. 7, 2018, which designated the U.S., the entire contents of which is incorporated herein by reference in its entirety.

TECHNICAL FIELD

The invention relates to an electronic device and a method of manufacturing an electronic device.

TECHNOLOGICAL BACKGROUND

Designing electronic devices capable of operating in the so-called "mm-wave" range of the spectrum (i.e. between 30 GHz and 300 GHz) poses a number of challenges, one being the need for filters with appropriate performance characteristics (low insertion loss and high Q-factor). Furthermore, the continuous demand for small form factors and improved performance at lower costs must also be taken into consideration.

SUMMARY OF THE INVENTION

There may be a need to obtain an electronic device having a small form factor and excellent characteristics for operating at high frequencies, in particular with regard to insertion loss.

According to an exemplary embodiment of the invention, an electronic device is provided which comprises an electronic component, in particular an electronic component having a planar shape, and a component carrier in which the electronic component is embedded. The component carrier comprises a first component carrier part having a first cut-out portion. The component carrier further comprises a second component carrier part having a second cut-out portion. The first cut-out portion and the second cut-out portion face opposite main surfaces of the electronic component. An electrically conductive material is provided on the surface of the first cut-out portion and on the surface of the second cut-out portion. The first cut-out portion and the second cut-out portion respectively form a first cavity and a second cavity on opposite sides of the electronic component.

According to another exemplary embodiment of the invention, a method of manufacturing an electronic device is provided, wherein the method comprises providing a first component carrier part having a first cut-out portion, providing a second component carrier part having a second cut-out portion, providing an electrically conductive material on the surface of the first cut-out portion and on the surface of the second cut-out portion, arranging an electronic component, in particular an electronic component having a planar shape, between the first component carrier part and the second component carrier part, such that the first cut-out portion and the second cut-out portion face opposite main surfaces of the electronic component, and connecting the first component carrier part and the second component carrier part with each other to form a component carrier embedding the electronic component, wherein the first cut-out portion and the second cut-out portion respectively form a first cavity and a second cavity on opposite sides of the electronic component.

Overview of Embodiments

In the context of the present application, the terms "first component carrier part" and "second component carrier part" may particularly denote two initially separate parts (e.g. an upper part and a lower part) which, when brought together, combine to form a component carrier.

In the context of the present application, the terms "first cut-out portion" and "second cut-out portion" may particularly denote respective portions of the first component carrier part and the second component carrier part where a recess is formed by removing some material, e.g. by cutting, in particular laser cutting, etching, milling etc.

In the context of the present application, the term "electronic component having a planar shape" may particularly denote a substantially flat electronic component with a very small height in comparison to the width and length of the electronic component and thereby having two opposite main surfaces, e.g., an upper main surface and a lower main surface.

In the context of the present application, the term "component carrier" may particularly denote any support structure which is capable of accommodating one or more electronic components thereon and/or therein for providing both mechanical support and electrical connectivity.

According to an exemplary embodiment of the invention, cavities are provided within a component carrier on opposite sides of a planar electronic component. The cavities are delimited by surfaces (cut-out portions) within the component carrier which comprise an electrically conductive material, such as copper or another conductive metal. The cavities allow electromagnetic waves to propagate in the vicinity of the electronic component while the electrically conductive material provided on the cavity surfaces provides efficient electromagnetic shielding. Therefore, a compact electronic device with an embedded electronic device capable of operating efficiently within a wide range of frequencies is provided. Advantageously, this is done in a way which keeps the size of the electronic device very small and which does not require implementation of other materials or processes than those from circuit board formation technology.

In the following, further exemplary embodiments of the present invention will be explained.

In an embodiment, the electronic component comprises an RF substrate, in particular an RF substrate suitable for applications within the frequency range of 30 GHz to 300 GHz ("mm wave"). Such a substrate may form an effective basis for a wide range of RF components, including filters.

In an embodiment, the RF substrate comprises a first electrically conductive layer structure on a first main surface and a second electrically conductive layer structure on a second main surface opposite from the first main surface.

In the context of the present application, the term "layer structure" may particularly denote a continuous layer, a patterned layer or a plurality of non-consecutive islands within a common plane.

The specific layout of the first and second electrically conductive layer structures determine the electrical characteristics of the electronic component, such as one or more cut-off frequencies of a filter.

In an embodiment, the electronic component is a stripline, in particular a stripline filter adapted to operate in a frequency range of 30 GHz to 300 GHz. However, the stripline may be any kind of filter, such as a coplanar filter.

Due to the cavities being on both sides of the electronic component and due to the electrically conductive wall surfaces of these cavities, the arrangement of the electronic component (stripline) within the component carrier corresponds to a so-called "suspended stripline substrate", albeit in a very compact form without the need for a surrounding metallic housing.

In an embodiment, the first cavity and the second cavity are filled with air.

In an embodiment, the surface of the first cut-out portion and the surface of the second cut-out portion are completely covered by electrically conductive material.

Thereby, optimal shielding of the electronic component interposed between the cavities can be assured.

In an embodiment, the first cavity comprises a depth in the range of 0.1 mm to 2 mm, such as in the range of 0.5 mm to 1.5 mm, such as around 1 mm, and the second cavity comprises a depth in the range of 0.1 mm to 2 mm, such as in the range of 0.5 mm to 1.5 mm, such as around 1 mm. Here, the term "depth" refers to the dimension in a direction perpendicular to the main surfaces of the electronic component.

In an embodiment, the component carrier comprises at least one via for contacting a portion of the electronic component which is outside of the first and second cavities.

In other words, the via does not extend through the cavity but beside the cavity to thereby obtain electrical contact with a part (e.g., a terminal) of the electronic component that is not in direct contact with the cavity.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular a laminate formed by applying mechanical pressure, or if desired mechanical pressure in combination with thermal energy. Therefore, the mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the electronic component is mounted on and/or embedded in the at least one electrically insulating layer structure and/or the at least one electrically conductive layer structure.

In an embodiment, the electronic device may comprise at least one further component selected from a group consisting of an electronic component, an electrically non-conductive and/or electrically conductive element, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

The at least one further component can be selected from a group consisting of an electrically non-conductive element, an electrically conductive inlay (such as a metal inlay, preferably comprising copper or aluminum), a heat transfer unit (for example a heat pipe), a light guiding element, for example an optical waveguide or a light conductor connection, an electronic component, or combinations thereof. For example, the further component(s) can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component(s) may also be a further component carrier, for example in a board-in-board configuration. The further component(s) may be surface mounted on the component carrier and/or may be embedded in an interior thereof. Moreover, also other components, in particular those components which generate and emit electromagnetic radiation and/or components which are sensitive with regard to electromagnetic radiation propagating from an environment, may be used as the further component(s).

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with graphene.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon®), a ceramic, and a metal oxide. Teflon is a registered mark of The Chemours Company FC LLC of Wilmington, Del., U.S.A. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the component carrier is shaped as a plate. This contributes to the compact design, wherein the component carrier nevertheless provides a large surface for mounting components thereon. Furthermore, in particular a naked die as example for an embedded electronic component, can be conveniently embedded, due to the small thickness thereof, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the introduction of thermal energy to an environment encompassing the layer structures. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling the through holes with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. The one or more components may be connected to the respective main surface by soldering. A dielectric part of a PCB may be composed of resin with reinforcing fibers (such as glass fibers).

In an embodiment, the component carrier is configured as a laminate-type component carrier. In such an embodiment, the component carrier is a compound of multiple layer structures which are stacked and connected together by applying a pressing force, if desired accompanied by the introduction of heat to an environment encompassing the stacked layer structures.

In an embodiment, the method further comprises the following steps prior to the step of pressing the first component carrier part and the second component carrier part against each other: providing a first adhesive layer between the first component carrier part and the electronic component, and providing a second adhesive layer between the second component carrier part and the electronic component.

The first adhesive layer may be provided on either one of the first component carrier part and the electronic component and the second adhesive layer may be provided on either one of the second component carrier part and the electronic component prior to pressing.

The first and second adhesive layers serve to bond the first and second component carrier parts and the electronic component together, thereby forming an integral device in which the electronic component is embedded.

In an embodiment, the first adhesive layer comprises a cut-out portion corresponding to the first cut-out portion and/or the second adhesive layer comprises a cut-out portion corresponding to the second cut-out portion.

The respective cut-out portions in the first and second adhesive layers are aligned with the (first and second) cut-out portions in the first and second component carrier parts and thus form part of the first and second cavities, respectively.

In an embodiment, the first adhesive layer and the second adhesive layer comprise a no-flow prepreg material or a low-flow prepreg material. Generally, the difference between a (normal) prepreg material and a low-flow or low-flow prepreg material is the degree of curing. Therefore, when combining two layers having a cavity, a very poor resin flow assures that the cavity itself is not contaminated by the resin even during a hot press cycle.

By using a no-flow prepreg material in the adhesive layers, the risk of deforming or blocking the first and/or second cavity during the pressing step is significantly reduced.

In an embodiment, the step of connecting comprises pressing the first component carrier part and the second component carrier part against each other.

DETAILED DESCRIPTION OF ILLUSTRATED EMBODIMENTS

Figure 1:
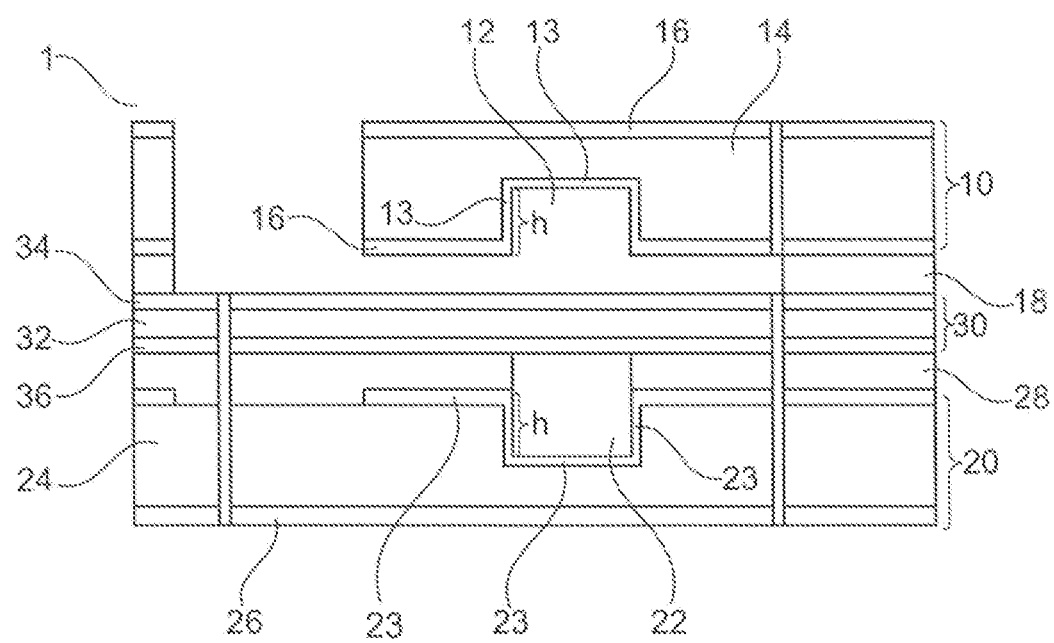
FIG. 1 shows a cross-sectional view of an electronic device according to an exemplary embodiment of the invention.

The illustrations in the drawings are schematically presented. In different drawings, similar or identical elements are provided with the same reference signs.

FIG. 1 shows a cross-sectional view of an electronic device 1 according to an exemplary embodiment of the invention. More specifically, the electronic device 1 comprises an electronic component 30 having a planar shape and embedded in a component carrier comprising a first (upper) component carrier part 10 and a second (lower) component carrier part 20.

The electronic component 30 in this embodiment is a stripline formed of an RF substrate 32 with electrically conducting layer structures 34 and 36 on main surfaces thereof.

The first component carrier part 10 comprises a layer 14 of core material, such as FR-4, in which a first cut-out portion 12 of height h is formed. The surface of the cut-out portion 12 in the layer 14 of core material is provided with an electrically conductive material 13, such as copper, and electrically conductive material 16 is also applied to the upper and lower surfaces of the core material 14.

Similarly, the second component carrier part 20 comprises a layer 24 of core material, such as FR-4, in which a second cut-out portion 22 of height h is formed. The surface of the cut-out portion 22 in the layer 24 of core material is provided with an electrically conductive material 23, such as copper, and electrically conductive material 26 is also applied to the upper and lower surfaces of the core material 24.

The cut-out portions (or recesses) 12 and 22 both face a respective main surface of the electronic component 30.

A layer 18 of no-flow prepreg material is interposed between the lower surface of the first component carrier part 10 and the upper surface of the electronic component 30. Similarly, a layer 28 of no-flow prepreg material is interposed between the upper surface of the second component carrier part 20 and the lower surface of the electronic component 30. As shown herein, the layers 18 and 28 of no-flow prepreg material do not cover the parts corresponding to the cut-out portions 12 and 22. Accordingly, the cut-out portions 12 and 22 define respective cavities on opposite sides of the electronic component. The surfaces delimiting the cavities are covered with the electrically conductive material 13, 23 and thus provide excellent electromagnetic shielding. The cavities are preferably filled with air or another medium suitable for propagation of electromagnetic waves.

In sum, the structure shown in FIG. 1 corresponds to and have similar advantageous properties as a suspended stripline structure (SSS), but in a much more compact package without the need for an external metal housing and the cost and labor associated with mounting thereof.

Figure 2:
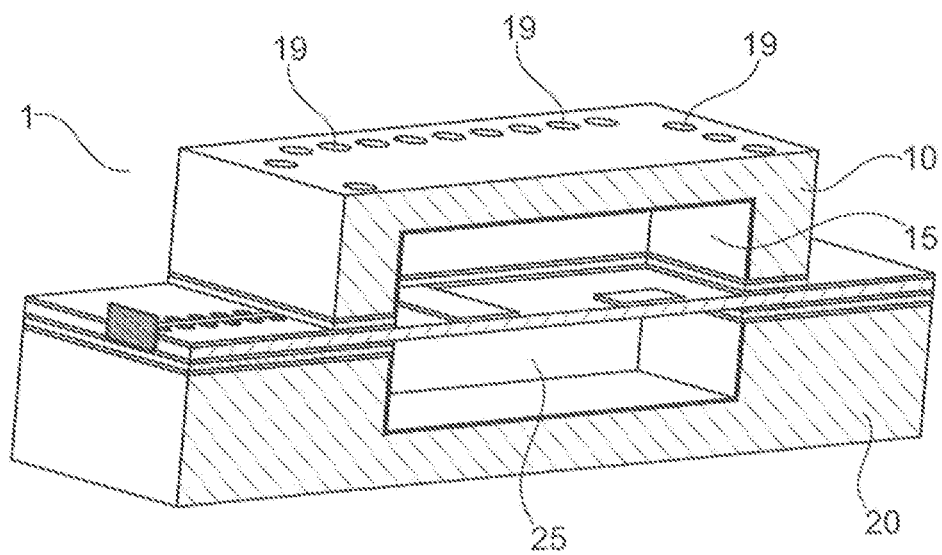
FIG. 2 shows a perspective cross-sectional view of the electronic device shown in FIG. 1.
Figure 3:
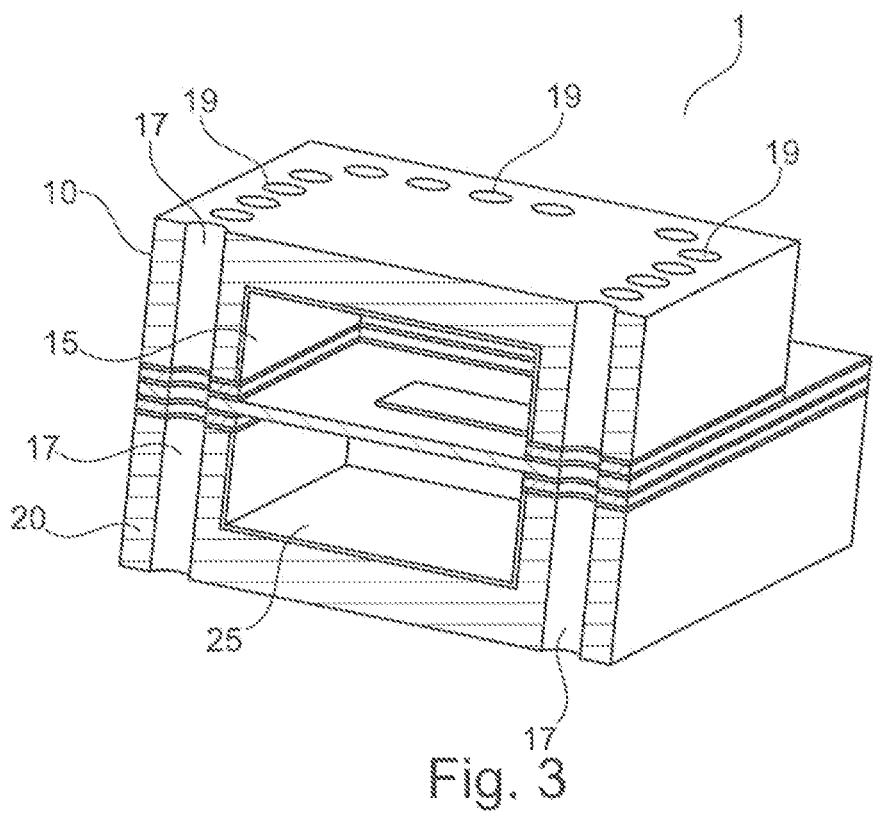
FIG. 3 shows another perspective cross-sectional view of the electronic device shown in FIG. 1.

FIG. 2 and FIG. 3 show perspective cross-sectional views of the structure shown in FIG. 1 in two respective directions. More specifically, FIG. 2 shows the electronic device 1 cut in a plane parallel to the plane of FIG. 1 while FIG. 3 shows the electronic device 1 cut in a plane perpendicular to the plane of FIG. 1.

Figure 4:
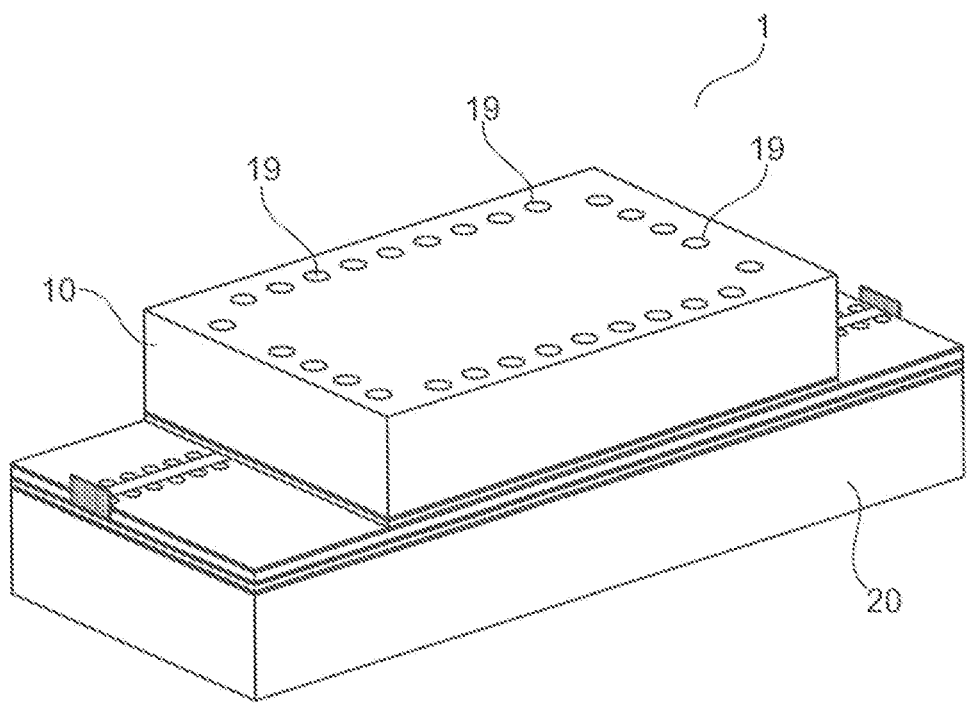
FIG. 4 shows a perspective view of the electronic device shown in FIG. 1.

FIG. 4 shows a perspective view of the electronic device 1 as it appears from the outside.

As can be seen in FIGS. 1 to 4, a number of terminals 19 are (FIGS. 2 to 4) formed in the electrically conductive material 16 (FIG. 1) on the upper surface of the first component carrier part 10. As indicated by reference numeral 17 in FIG. 3, the terminals 19 are connected to vias extending down into the device 1 besides the cavities 15 and 25 in FIG. 2 and FIG. 3. Thereby, the electronic component or stripline 30 as shown in FIG. 1 (and any other components in or on the electronic device 1) can communicate electrically with the outside.

Figure 5:
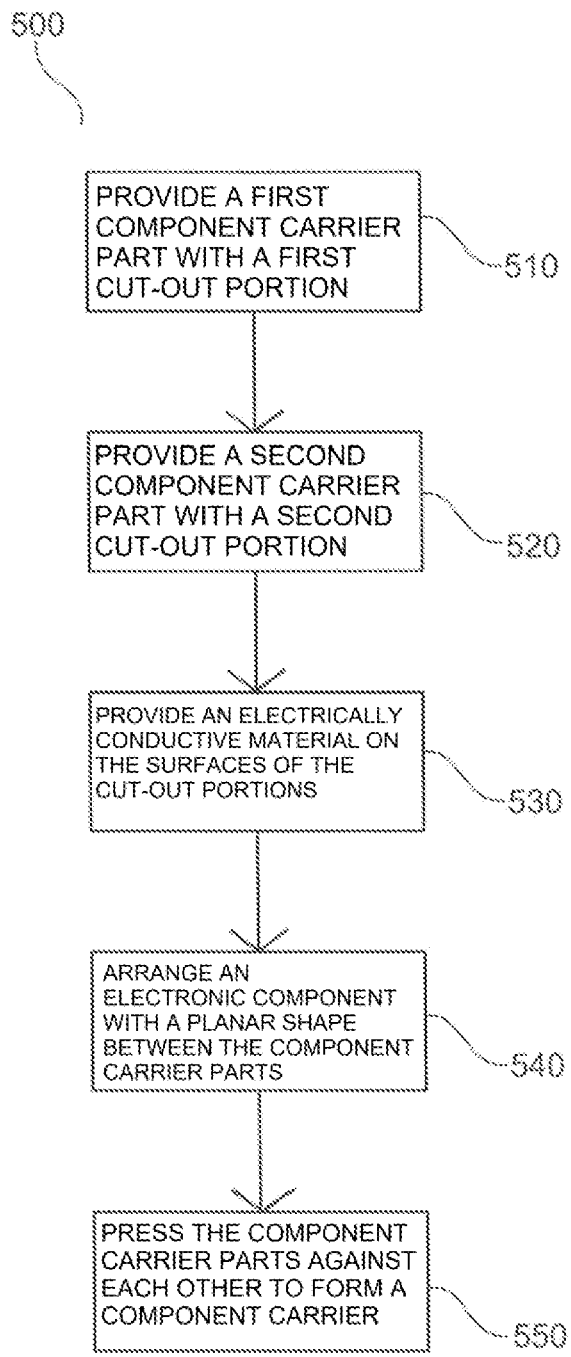
FIG. 5 shows a flow diagram of a method of manufacturing an electronic device in accordance with an exemplary embodiment of the invention.

FIG. 5 shows a flow diagram of a method 500 of manufacturing an electronic device according to an embodiment of the present invention, in particular the electronic device shown in FIGS. 1 to 4 and discussed above.

At step 510 a first component carrier part 10 having a first cut-out portion 12 is provided and at step 520 a second component carrier part 20 having a second cut-out portion 22 is provided.

At step 530 an electrically conductive material 13, 23 is provided on the surface of the first cut-out portion 12 and on the surface of the second cut-out portion 22, respectively.

At step 540 an electronic component 30 having a planar shape is arranged between the first component carrier part 10 and the second component carrier part 20, such that the first cut-out portion 12 and the second cut-out portion 22 face opposite main surfaces of the electronic component 30.

Finally, at step 550 the first component carrier part 10 and the second component carrier part 20 are pressed against each other to form a component carrier embedding the electronic component 30, wherein the first cut-out portion 12 and the second cut-out portion 22 respectively form a first cavity 15 and a second cavity 25 on opposite sides of the electronic component 30.

Preferably, a first adhesive layer 18 (comprising e.g. a non-flow pre-preg material) is arranged between the first component carrier part 10 and the electronic component 30 and a second adhesive layer 28 (comprising e.g. a non-flow prepreg material) is arranged between the second component carrier part 20 and the electronic component 30 prior to the pressing at step 550.

Summarizing, the present invention provides a compact and efficient device capable of operating at high RF frequencies (in particular in the "mm-wave" range, i.e. between 30 GHz and 300 GHz), which can be easily manufactured using embedded component packaging (ECP) techniques.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. An electronic device, comprising:
  an electronic component; and
  a component carrier in which the electronic component is embedded,
  wherein the component carrier comprises a first component carrier part having a first cut-out portion, and wherein the component carrier comprises a second component carrier part having a second cut-out portion, the first cut-out portion and the second cut-out portion facing opposite main surfaces of the electronic component,
  wherein an electrically conductive material is provided on the surface of the first cut-out portion and on the surface of the second cut-out portion,
  wherein the first cut-out portion and the second cut-out portion respectively form a first cavity and a second cavity on opposite sides of the electronic component,
  wherein the component carrier comprises a first adhesive layer between the first component carrier part and the electronic component,
  wherein the component carrier comprises a second adhesive layer between the second component carrier part and the electronic component,
  wherein the first adhesive layer and/or the second adhesive layer comprise a no-flow prepreg material or a low-flow prepreg material.

2. The electronic device according to claim 1, wherein the electronic component comprises an RF substrate.

3. The electronic device according to claim 2, wherein the RF substrate comprises a first electrically conductive layer structure on a first main surface and a second electrically conductive layer structure on a second main surface opposite from the first main surface.

4. The electronic device according to claim 1, wherein the electronic component is a stripline.

5. The electronic device according to claim 1, wherein the first cavity and the second cavity are filled with air.

6. The electronic device according to claim 1, wherein the surface of the first cut-out portion and the surface of the second cut-out portion are completely covered by electrically conductive material.

7. The electronic device according to claim 1, wherein the first cavity comprises a depth in the range of 0.1 mm to 2 mm, and wherein the second cavity comprises a depth in the range of 0.1 mm to 2 mm.

8. The electronic device according to claim 1, wherein the component carrier comprises a via.

9. The electronic device according to claim 1, wherein the component carrier comprises a stack of at least one electrically insulating layer structure and at least one electrically conductive layer structure.

10. The electronic device according to claim 9, wherein the electronic component is mounted on or embedded in the no-flow prepreg material or the low-flow prepreg material.

11. The electronic device according to claim 9, wherein the at least one electrically conductive layer structure comprises at least one of the group consisting of copper, aluminum, nickel, silver, gold, palladium, and tungsten.

12. The electronic device according to claim 9, wherein the at least one of the electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

13. The electronic device according to claim 1, wherein the first component carrier part has a dimension that is shorter than a respective dimension of the second component carrier part.

14. The electronic device according to claim 1, wherein the component carrier is configured as one of the group consisting of a printed circuit board, and a substrate.

15. The electronic device according to claim 1, wherein the component carrier is configured as a laminate-type component carrier.

16. A method of manufacturing an electronic device, the method comprising the steps of:
providing a first component carrier part having a first cut-out portion;
providing a second component carrier part having a second cut-out portion;
providing an electrically conductive material on the surface of the first cut-out portion and on the surface of the second cut-out portion;
arranging an electronic component between the first component carrier part and the second component carrier part, such that the first cut-out portion and the second cut-out portion face opposite main surfaces of the electronic component;
providing a first adhesive layer between the first component carrier part and the electronic component;
providing a second adhesive layer between the second component carrier part and the electronic component;
wherein the first adhesive layer and/or the second adhesive layer comprise a no-flow prepreg material or a low-flow prepreg material; and
connecting the first component carrier part and the second component carrier part with each other to form a component carrier embedding the electronic component,
wherein the first cut-out portion and the second cut-out portion respectively form a first cavity and a second cavity on opposite sides of the electronic component.

17. The method according to claim 16, wherein the step of connecting comprises pressing the first component carrier part and the second component carrier part against each other.

18. The method according to claim 16, wherein the first adhesive layer comprises a cut-out portion corresponding to the first cut-out portion and/or wherein the second adhesive layer comprises a cut-out portion corresponding to the second cut-out portion.

* * * * *